(12) United States Patent
Lee et al.

(10) Patent No.: US 9,465,058 B2
(45) Date of Patent: Oct. 11, 2016

(54) TEST CIRCUIT AND SEMICONDUCTOR APPARATUS INCLUDING THE SAME

(71) Applicant: SK hynix Inc., Icheon-si Gyeonggi-do (KR)

(72) Inventors: Dong Uk Lee, Icheon-si (KR); Young Ju Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/867,188

(22) Filed: Sep. 28, 2015

(65) Prior Publication Data

US 2016/0018445 A1    Jan. 21, 2016

Related U.S. Application Data

(62) Division of application No. 13/604,491, filed on Sep. 5, 2012, now Pat. No. 9,176,190.

(30) Foreign Application Priority Data

Apr. 4, 2012  (KR) .................. 10-2012-0035020

(51) Int. Cl.
| | |
|---|---|
| G01R 19/00 | (2006.01) |
| G01R 31/3185 | (2006.01) |
| G01R 31/04 | (2006.01) |
| H01L 23/48 | (2006.01) |
| H01L 25/065 | (2006.01) |

(52) U.S. Cl.
CPC ........... *G01R 19/0092* (2013.01); *G01R 31/04* (2013.01); *G01R 31/318513* (2013.01); *H01L 23/481* (2013.01); *H01L 25/0657* (2013.01); *H01L 2225/06541* (2013.01); *H01L 2225/06596* (2013.01); *H01L 2924/0002* (2013.01)

(58) Field of Classification Search
CPC ................ H01L 2224/73265; H01L 25/0657; H01L 2225/06541; H01L 2224/16145; H01L 23/481; H01L 24/49; H01L 24/83; G01R 31/318513; G01R 31/3187; G01R 31/31717; G01R 31/31855; G01R 31/2601; G01R 31/28
See application file for complete search history.

(56) References Cited

U.S. PATENT DOCUMENTS

| | | | | |
|---|---|---|---|---|
| 2003/0008424 A1* | 1/2003 | Kajiwara | ........... | G01R 31/2853 438/18 |
| 2010/0295600 A1* | 11/2010 | Kim | .................... | H01L 25/0657 327/365 |

* cited by examiner

*Primary Examiner* — Tung X Nguyen
(74) *Attorney, Agent, or Firm* — William Park & Associates Ltd.

(57) ABSTRACT

A test circuit includes a through via test unit configured to be set to a first resistance value in response to a first test control signal and to a second resistance value in response to the first test control signal and a second test control signal, and form a current path including a through via that electrically connects a first chip and a second chip; and a test measurement unit configured to supply a test voltage to the through via and measure a current flowing through the through via.

10 Claims, 5 Drawing Sheets

TEST CIRCUIT AND SEMICONDUCTOR APPARATUS INCLUDING THE SAME

CROSS-REFERENCE TO RELATED APPLICATION

The present application claims priority under 35 U.S.C. §119(a) to Korean application number 10-2012-0035020, filed on Apr. 4, 2012, in the Korean Intellectual Property Office, which is incorporated herein by reference in its entirety.

BACKGROUND

1. Technical Field

The present invention relates generally to a semiconductor apparatus, and in particular to a 3D (three-dimensional) semiconductor apparatus that employs through vias.

2. Related Art

In order to improve the degree of integration of a semiconductor apparatus, a 3D (three-dimensional) semiconductor apparatus, in which a plurality of chips are stacked and packaged to increase the degree of integration, has been developed. In the 3D semiconductor apparatus, since two or more chips are vertically stacked, a maximum degree of integration may be achieved in the same area.

Various methods may be applied to realize the 3D semiconductor apparatus. In one of the methods, a plurality of chips having the same structure are stacked and are then connected with one another using wires, such as metal lines, such that the plurality of chips may operate as one semiconductor apparatus.

Recently, a TSV (through-silicon via) type semiconductor apparatus has been disclosed in the art, in which through-silicon vias are formed to pass through a plurality of stacked chips so that all the chips are electrically connected with one another. In the TSV type semiconductor apparatus, because the through-silicon vias vertically pass through the respective chips to electrically connect them with one another, the area of a package may be effectively reduced when compared to a semiconductor apparatus in which respective chips are connected with one another through peripheral wiring using wires.

TSVs are formed by filling via holes, which are defined through a dielectric substance, with a conductive material. Since the TSVs serve as a means for electrically connecting the stacked chips, in order to manufacture a good quality semiconductor apparatus, it is essential to test whether the TSVs are properly formed.

FIG. 1 is a schematic view of a test circuit for a semiconductor apparatus known in the art. The semiconductor apparatus includes first and second chips CHIP1 and CHIP2, and the test circuit includes a test pad 10, a through via selection unit 20, and a driver 30. The test pad 10 applies a test voltage Vmeas to a through via VIA in a test operation, and measures the amount of current Imeas that flows through the through via VIA. The through via selection unit 20 selects the through via VIA to which the test voltage Vmeas is to be applied, in response to a test control signal TC. The through via selection unit 20 includes a pass gate that is turned on by the test control signal TC.

The driver 30 forms a current path in response to the test control signal TC. The driver 30 includes a MOS transistor that receives the test control signal TC through the gate thereof, and connects the through via VIA with a ground potential. Accordingly, if the through via selection unit 20 and the driver 30 are turned on by the test control signal TC, a current path is formed from the test pad 10 through the driver 30. As the test pad 10 applies the test voltage Vmeas, current flows through the through via selection unit 20, the through via VIA, and the driver 30, and the test pad 10 can then measure the amount of current Imeas.

By measuring the amount of current Imeas, the resistance value of the through via VIA may be calculated from the following equations:

$$Rdrv + Rtsv + Rpg = Vmeas/Imeas$$

$$Rtsv = Vmeas/Imeas - (Rdrv + Rpg)$$

Where Rdrv is the ON resistance of the driver 30, Rtsv is the resistance value of the through via VIA, and Rpg is the ON resistance of the pass gate included in the selection unit 20.

As can be appreciated from the above equations, Rtsv depends on Rdrv and Rpg. However, in general, since the resistance of the through via VIA is substantially smaller than the ON resistance of the pass gate and the driver 30, and the characteristics of these devices may change due to a variation in process, etc., it is difficult to measure the resistance of the through via VIA with precision.

SUMMARY

These needs and others are satisfied by a test circuit in accordance with the present invention, which measures an amount of current flowing through a through via a plurality of times, thereby being capable of checking precisely whether the through via is properly formed.

In one embodiment in accordance with the present invention, a test circuit comprises: a through via test unit configured to be set to a first resistance value in response to a first test control signal and to a second resistance value in response to the first test control signal and a second test control signal, and form a current path that includes a through via that electrically connects a first chip and a second chip; and a test measurement unit configured to supply a test voltage to the through via and to measure an amount of current flowing through the through via.

In another embodiment in accordance with the present invention, a test circuit comprises: a first selection part configured to apply a test voltage to a through via, that electrically connects first and second chips, in response to a first test control signal; a second selection part configured to apply the test voltage to the through via in response to a second test control signal; a first driver part configured to drive the through via to a ground potential in response to the first test control signal; and a second driver part configured to drive the through via to the ground potential in response to the second test control signal.

In yet another embodiment in accordance with the present invention, a test circuit comprises: a test control unit configured to generate a pulse of a first test control signal and then generate pulses of first and second test control signals; a voltage applying section configured to apply a first voltage to a through via, that electrically connects a first chip and a second chip, in response to the first test control signal, and apply a second voltage to the through via in response to the first and second test control signals; and a current sink section configured to sink current flowing through the through via with a first current sink capability in response to the first test control signal and sink current flowing through the through via with a second current sink capability in response to the first and second test control signals.

In still another embodiment in accordance with the present invention, a test method comprises: selecting a first resistor in response to a first test control signal, and measuring first current flowing through a path that includes a through via, electrically connecting first and second chips, and the first resistor; selecting a second resistor with a value different from the first resistor in response to the first test control signal and a second test control signal, and measuring second current flowing through a path that includes the through via and the second resistor; and comparing the first and second current and calculating a resistance value of the through via.

In yet a further embodiment in accordance with the present invention, a semiconductor apparatus, including a first through via that connects a first chip and a second chip, and a second through via that connects the second chip and a third chip, the first and second through vias being electrically connected with each other, comprises: a voltage applying section disposed in the first chip and configured to apply one of a first voltage and a second voltage to the first through via in response to first and second test control signals; a first current sink section disposed in the second chip and configured to sink current flowing through the first through via with one of first and second current sink capabilitys, in response to a chip select signal and the first and second test control signals; and a second current sink section disposed in the third chip and configured to sink current flowing through the first and second through vias with one of the first and second current sink capabilitys in response to the chip select signal and the first and second test control signals.

BRIEF DESCRIPTION OF THE DRAWINGS

The above and other features and advantages of the present invention will become readily apparent by reference to the following detailed description, when considered in conjunction with the accompanying drawings, in which.

DETAILED DESCRIPTION

Hereinafter, embodiments of the present invention will be explained in more detail with reference to the accompanying drawings. Although the present invention is described with reference to example embodiments thereof, it should be understood that numerous variations and modifications can be devised by those skilled in the art that will fall within the spirit and scope of the invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
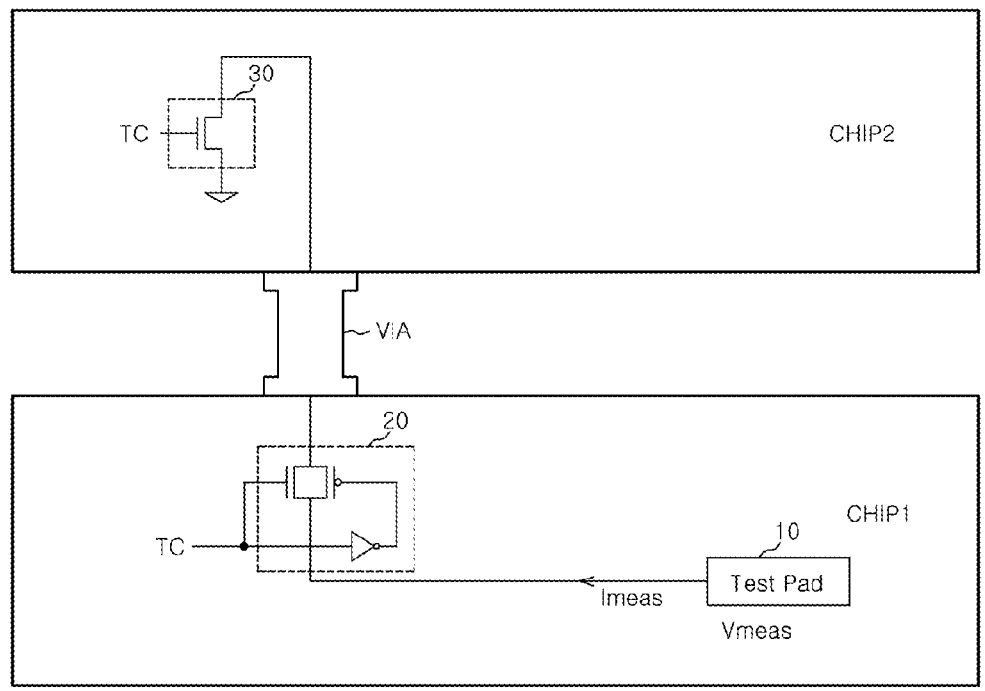
FIG. 1 is a schematic view of a test circuit for a semiconductor apparatus known in the art.
Figure 2:
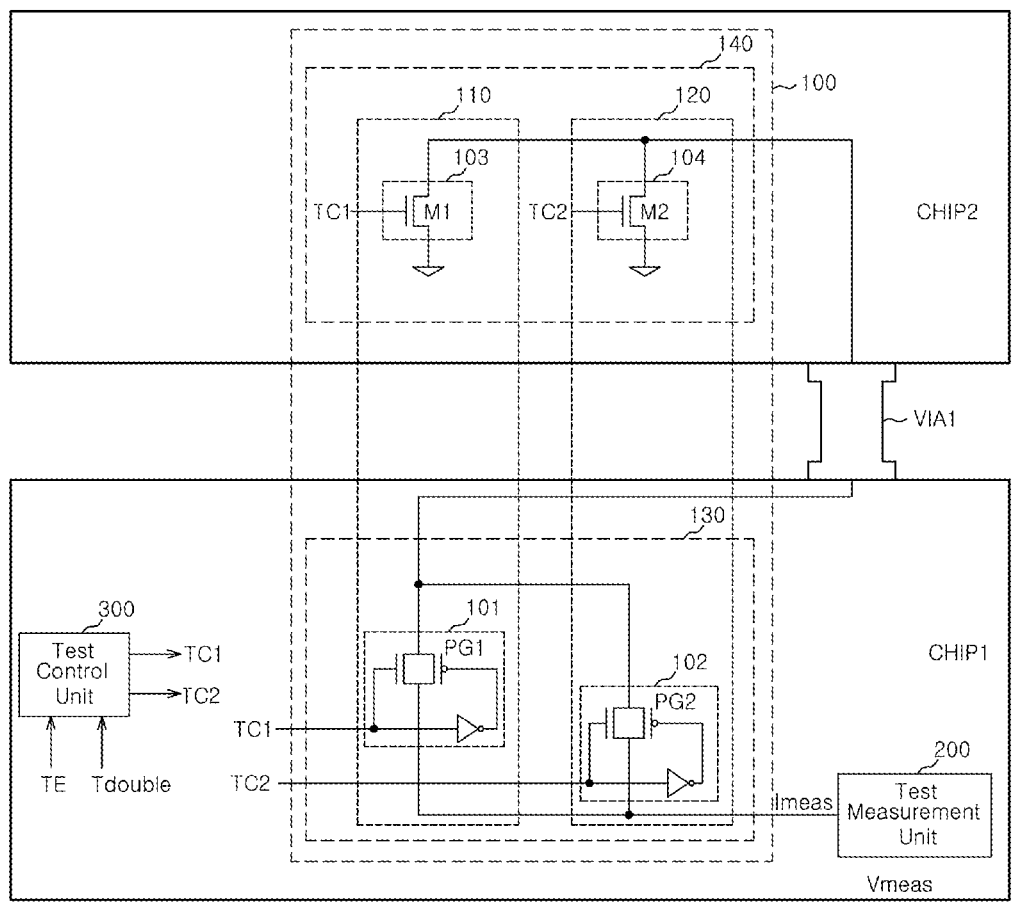
FIG. 2 is a schematic view of an embodiment of a semiconductor apparatus in accordance with the present invention.

In FIG. 2, the semiconductor apparatus 1 includes first and second chips CHIP1 and CHIP2. The first and second chips CHIP1 and CHIP2 are stacked and packaged together to constitute a single semiconductor apparatus. The first and second chips CHIP1 and CHIP2 may be electrically connected with each other through one or more through vias, such as through via VIA1.

The semiconductor apparatus 1 includes a through via test unit 100 and a test measurement unit 200. The through via test unit 100 is configured to change a condition for testing the through via VIA1, and thereby change a current or voltage associated with the through via VIA1. The through via test unit 100 receives a first test control signal TC1 and a second test control signal TC2. The through via test unit 100 may be configured to have different resistance values in response to the first and second test control signals TC1 and TC2. For example, the through via test unit 100 may be configured to have a first resistance value when the first test control signal TC1 is enabled, and may be configured to have a second resistance value when both the first and second test control signals TC1 and TC2 are enabled.

The through via test unit 100 forms current paths along with the through via VIA1 when the through via test unit 100 is configured to have the first and second resistance values in response to the first and second test control signals TC1 and TC2. That is to say, the current paths are formed to be connected through the through via test unit 100, the through via VIA1 and the test measurement unit 200. Accordingly, the through via test unit 100 forms the current paths, which have different resistance values, in response to the first and second test control signals TC1 and TC2, such that the value of current or voltage associated with the through via VIA1 may be measured under various conditions.

The test measurement unit 200 may be configured to apply a test voltage Vmeas to the through via test unit 100. Any kinds of voltages may be used as the test voltage Vmeas. Also, the test measurement unit 200 may be configured to measure an amount of current flowing through the through via VIA1 when a current path is formed by the through via test unit 100. The test measurement unit 200 may be realized as a circuit block capable of performing functions of applying the test voltage Vmeas and measuring output current Imeas. Also, the test measurement unit 200 may be realized as a test pad and test equipment connected thereto.

In an embodiment, the through via test unit 100 includes a first test section 110 and a second test section 120. The first test section 110 is configured to have a first resistance value in response to the first test control signal TC1, and form a current path along with the through via VIA1. The second test section 120 is configured to have a second resistance value, along with the first test section 110, in response to the second test control signal TC2, and form a current path along with the through via VIA1. When the first test control signal TC1 is enabled, the through via test unit 100 is configured to have the first resistance value, provided by the first test section 110. When the test voltage Vmeas is applied, the amount of current flowing through the through via VIA1 is determined depending upon the first resistance value and the resistance value of the through via VIA1 itself. When both the first and second test control signals TC1 and TC2 are enabled, the through via test unit 100 is configured to have the second resistance value, provided by both the first and second test sections 110 and 120. When the test voltage Vmeas is applied, an amount of current flowing through the through via VIA1 may be determined depending upon the second resistance value and the resistance value of the through via VIA1 itself.

The first test section 110 includes a first selection part 101 and a first driver part 103. The first selection part 101 is configured to apply the test voltage Vmeas to one end of the through via VIA1 in response to the first test control signal TC1. The first driver part 103 connects the other end of the through via VIA1 with a ground voltage terminal in response to the first test control signal TC1. The first driver part 103 is configured to drive the through via VIA1 to a ground voltage in response to the first test control signal TC1.

The second test section 120 includes a second selection part 102 and a second driver part 104. The second selection part 102 is configured to apply the test voltage Vmeas to the one end of the through via VIA1 in response to the second test control signal TC2. The second driver part 104 connects the other end of the through via VIA1 with the ground voltage terminal in response to the second test control signal TC2. The second driver part 104 is configured to drive the through via VIA1 to the ground voltage in response to the second test control signal TC2.

In an embodiment in accordance with the present invention, the through via test unit 100 includes a voltage applying section 130 and a current sink section 140. The voltage applying section 130 is configured to apply a first voltage to the through via VIA1 in response to the first test control signal TC1 and apply a second voltage to the through via VIA1 in response to the first and second test control signals TC1 and TC2. The first and second voltages may be voltages with different levels. For example, the second voltage may have a level higher than the first voltage. The current sink section 140 is configured to sink the current flowing through the through via VIA1 with a first current sink capability in response to the first test control signal TC1 and sink the current flowing through the through via VIA1 with a second current sink capability in response to the first and second test control signals TC1 and TC2.

The voltage applying section 130 includes the first and second selection parts 101 and 102. The first selection part 101 is configured to apply the test voltage Vmeas to the through via VIA1 in response to the first test control signal TC1. The second selection part 102 is configured to apply the test voltage Vmeas to the through via VIA1 in response to the second test control signal TC2.

The current sink section 140 includes the first and second driver parts 103 and 104. The first driver part 103 connects the through via VIA1 with the ground voltage in response to the first test control signal TC1 and drives the through via VIA1 to the ground voltage. The second driver part 104 connects the through via VIA1 with the ground voltage in response to the second test control signal TC2 and drives the through via VIA1 to the ground voltage.

In FIG. 2, the semiconductor apparatus 1 further includes a test control unit 300. The test control unit 300 is configured to generate the first and second test control signals TC1 and TC2 in response to a test enable signal TE and a double test signal Tdouble which will be described later in detail. The test control unit 300 generates the pulse of the first test control signal TC1 when the test enable signal TE is enabled and the double test signal Tdouble is disabled. The test control unit 300 generates the pulses of the first and second test control signals TC1 and TC2 when both the test enable signal TE and the double test signal Tdouble are enabled. Accordingly, the test enable signal TE is a signal for generating the pulses of the first and second test control signals TC1 and TC2, and the double test signal Tdouble is a signal for selectively generating the pulse of the second test control signal TC2. For example, the test control unit 300 may first generate the pulse of the first test control signal TC1 and then generate the pulses of the first and second test control signals TC1 and TC2 together. The test control unit 300 will be described later in detail.

In FIG. 2, the first selection part 101 includes a first pass gate PG1. The first pass gate PG1 is turned on in response to the first test control signal TC1. When turned on by the first test control signal TC1, the first pass gate PG1 connects the test measurement unit 200 with the one end of the through via VIA1. Therefore, when turned on, the first pass gate PG1 may apply the test voltage Vmeas applied from the test measurement unit 200, to the one end of the through via VIA1. The second selection part 102 includes a second pass gate PG2. The second pass gate PG2 is turned on in response to the second test control signal TC2. When turned on by the second test control signal TC2, the second pass gate PG2 connects the test measurement unit 200 with the one end of the through via VIA1. Therefore, when turned on, the second pass gate PG2 may apply the test voltage Vmeas applied from the test measurement unit 200, to the one end of the through via VIA1.

The first and second pass gates PG1 and PG2 are substantially the same elements and have substantially the same resistance value when turned on. When a test is performed for the through via VIA1 of the semiconductor apparatus 1, as described above, the first test control signal TC1 may be generated first, and then the first and second test control signals TC1 and TC2 may be generated. The first and second pass gates PG1 and PG2 are connected in parallel between the test measurement unit 200 and the through via VIA1. Accordingly, the first and second pass gates PG1 and PG2 may control the resistance value of the voltage applying section 130. When only the first test control signal TC1 is generated, the voltage applying section 130 has a resistance value corresponding to when the first pass gate PG1 is turned on. When both the first and second test control signals TC1 and TC2 are generated together, the voltage applying section 130 has a parallel resistance value corresponding to when the first and second pass gates PG1 and PG2 are turned on. Thus, the resistance value of the voltage applying section 130 when only the first pass gate PG1 is turned on may be about two times the resistance value of the voltage applying section 130 when both the first and second pass gates PG1 and PG2 are turned on. That is to say, the first resistance value may be about two times the second resistance value. The magnitude of the voltage applied by the voltage applying section 130 to the through via VIA1 is changed according to the resistance value of the voltage applying section 130. The level of the voltage applied to the through via VIA1 when the voltage applying section 130 is set to the first resistance value is about ½ times the level of the voltage applied to the through via VIA1 when the voltage applying section 130 is set to the second resistance value. In other words, the first voltage is about ½ times the second voltage. Hence, the voltage applying section 130 including the first and second selection parts 101 and 102 which are constituted by the first and second pass gates PG1 and PG2 may be set to different resistance values to change the level of the voltage applied to the through via VIA1.

In FIG. 2, the first driver part 103 includes a first MOS transistor M1. The first MOS transistor M1 has a gate which receives the first test control signal TC1, a source which is connected with the ground voltage and a drain which is connected with the other end of the through via VIA1. Accordingly, when turned on by the first test control signal TC1, the first MOS transistor M1 may connect the other end of the through via VIA1 with the ground voltage and may drive the current flowing through the through via VIA1 to the ground voltage. The second driver part 104 includes a second MOS transistor M2. The second MOS transistor M2 has a gate which receives the second test control signal TC2, a source which is connected with the ground voltage and a drain which is connected with the other end of the through via VIA1. Accordingly, when turned on by the second test control signal TC2, the second MOS transistor M2 may connect the other end of the through via VIA1 with the ground voltage and may drive the current flowing through the through via VIA1 to the ground voltage.

The first and second MOS transistors M1 and M2 are substantially the same elements and have substantially the same resistance value when turned on. When a test is performed for the through via VIA1 of the semiconductor apparatus 1, as described above, the first test control signal TC1 may be generated first, and then the first and second test control signals TC1 and TC2 may be generated. The first and second MOS transistors M1 and M2 are connected in parallel between the other end of the through via VIA1 and the ground voltage. Accordingly, the first and second MOS transistors M1 and M2 may control the resistance value and the current sink capability of the current sink section 140. When only the first test control signal TC1 is generated, the current sink section 140 has a resistance value corresponding to when the first MOS transistor M1 is turned on. Also, the first MOS transistor M1 has a current sink capability which drives the through via VIA1 to the ground voltage. When both the first and second test control signals TC1 and TC2 are generated together, the current sink section 140 has a parallel resistance value corresponding to when the first and second MOS transistors M1 and M2 are turned on. Thus, the resistance value of the current sink section 140 when only the first MOS transistor M1 is turned on may be about two times the resistance value of the current sink section 140 when both the first and second MOS transistors M1 and M2 are turned on. Also, the current sink capability for the current sink section 140 to drive the through via VIA1 to the ground voltage when both the first and second MOS transistors M1 and M2 are turned on together is about two times the current sink capability for the current sink section 140 to drive the through via VIA1 to the ground voltage when only the first MOS transistor M1 is turned on. That is to say, the second current sink capability is about two times the first current sink capability. The amount of current flowing from the through via VIA1 to the ground voltage is changed according to the resistance value of the current sink section 140 and the current sink capability of the current sink section 140. Hence, the current sink section 140 including the first and second driver parts 103 and 104 which are constituted by the first and second MOS transistors M1 and M2 may be set to different resistance values and have different current sink capabilitys to change the amount of current flowing through the through via VIA1.

Figure 3:
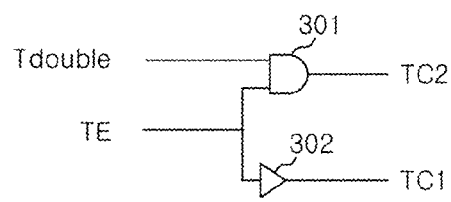
FIG. 3 depicts the test control unit 300 of FIG. 2 in schematic form, and includes an associated timing diagram.
Figure 3:
Figure 3:
Figure 3:
Figure 3:

In FIG. 3, the test control unit 300 includes an AND gate 301 and a buffer 302. The AND gate 301 receives the test enable signal TE and the double test signal Tdouble and generates the second test control signal TC2. The buffer 302 receives the test enable signal TE and generates the first test control signal TC1. Accordingly, the first test control signal TC1 may be generated each time the test enable signal TE is inputted, and the second test control signal TC2 may be generated when the test enable signal TE and the double test signal Tdouble are inputted together. The test enable signal TE and the double test signal Tdouble may be generated by decoding test address signals which are inputted for performing a test. Alternatively, the test enable signal TE and the double test signal Tdouble may be signals which are directly inputted from an outside of the semiconductor apparatus. Meanwhile, the generation of the first and second test control signals TC1 and TC2 may be implemented in a variety of ways. For example, the test control unit 300 may generate the first and second test control signals TC1 and TC2 together and then generate one of the first and second test control signals TC1 and TC2, and may generate an increased number of pulses of test control signals. A person of ordinary skill in the art will readily appreciate that a scheme for generating the test control signals in accordance with the embodiment of the present invention may be changed and modified in a variety of ways.

Operation of the semiconductor apparatus in an embodiment will be described below with reference to FIGS. 2 and 3. In order to test whether the through via VIA1 which connects the first and second chips CHIP1 and CHIP2 is normally formed or not, the test voltage Vmeas is applied to the through via VIA1. First, when the first test control signal TC1 is enabled, the first selection part 101 and the first driver part 103 are turned on. At this time, an amount of current Imeas1 flowing through the current path which is formed among the voltage applying section 130, the through via VIA1 and the current sink section 140 and an overall resistance value Rtot1 may be calculated as in the following equation:

$$Rtot1 = Rdrv1 + Rtsv + Rpg1 = Vmeas/Imeas1$$

When the first and second test control signals TC1 and TC2 are enabled together, the first and second selection parts 101 and 102 and the first and second driver parts 103 and 104 are all turned on. Consequently, an amount of current Imeas2 flowing through the current path which is formed among the voltage applying section 130, the through via VIA1 and the current sink section 140 may be measured, and an overall resistance value Rtot2 may be calculated from the following equation:

$$Rtot2 = (Rdrv1//Rdrv2) + Rtsv + (Rpg1//Rpg2) = Vmeas/Imeas2$$

Where the symbol // means "in parallel with." Since the resistance values of the first and second selection parts 101 and 102, which are turned on, are virtually the same, and the resistance values of the first and second driver parts 103 and 104, which are turned on, are also virtually the same, the value of Rtsv may be calculated from the following equation:

$$Rtsv = 2Rtot2 - Rtot1$$

As described above, by measuring current or voltage flowing associated with a through via under different conditions, the resistance value of the through via may be precisely measured. In the test circuit or method of a semiconductor apparatus in an embodiment in accordance with the present invention, by measuring, a plurality of times, current or voltage associated with the through via, the influence of an element in a test circuit on measurement of the resistance value of the through via may be reduced. That is to say, even when a PVT variation occurs in the test circuit element, an influencing factor resulting from the variation in the element may be eliminated, and the resistance value of the through via may be precisely measured. By monitoring the measured resistance value of the through via, it is possible to precisely detect whether the through via was properly formed. For instance, if the resistance value is high, it may indicate that a conductive substance has not sufficiently filled in a via hole, and the through via is not properly formed.

Figure 4:
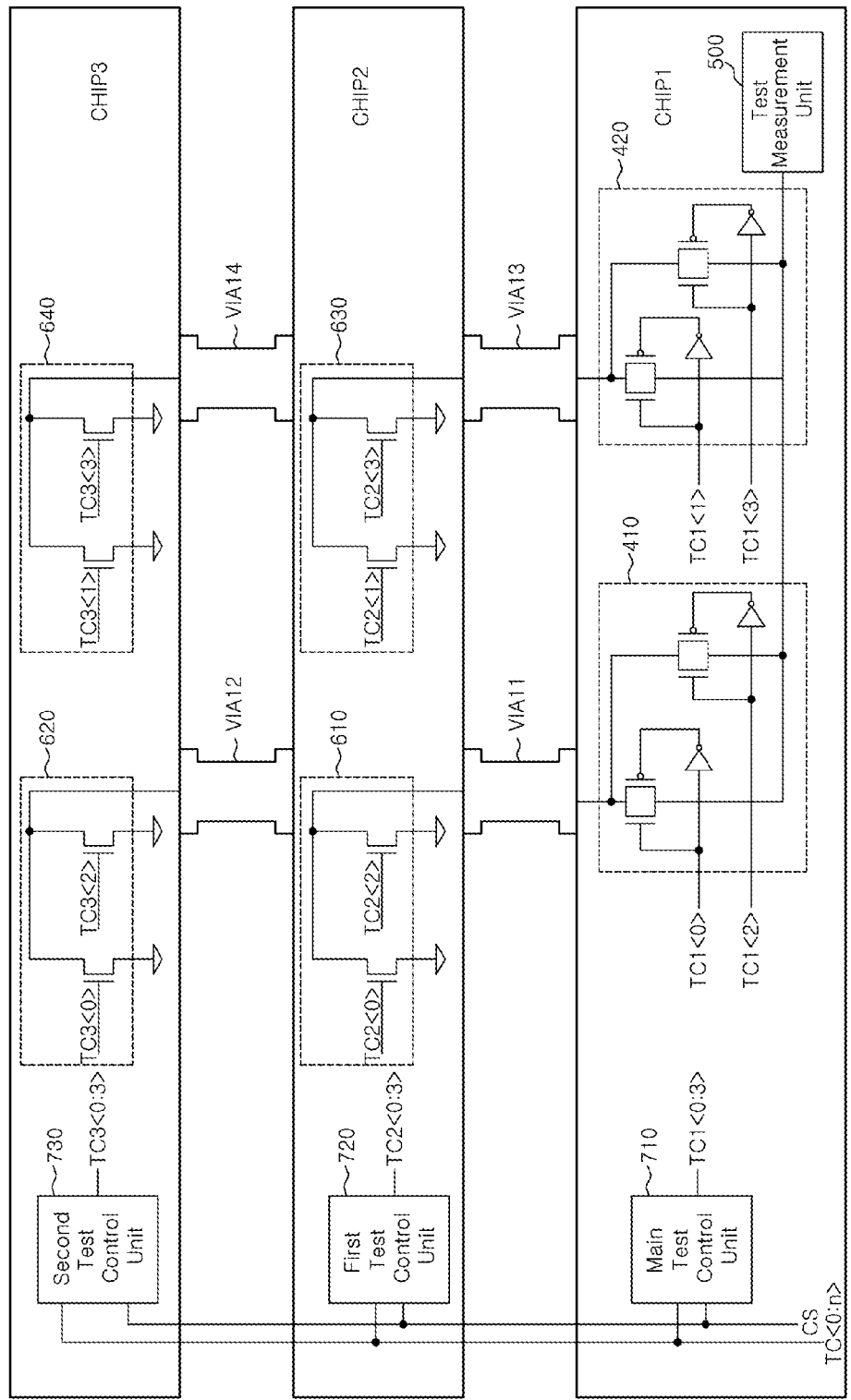
FIG. 4 is a schematic view of a semiconductor apparatus in accordance with another embodiment of the present invention.

In FIG. 4, the semiconductor apparatus includes first to third chips CHIP1, CHIP2 and CHIP3. The first to third chips CHIP1, CHIP2 and CHIP3 are stacked and packaged together to constitute a single semiconductor apparatus. The first and second chips CHIP1 and CHIP2 are electrically connected with each other through a first through via VIA11 and a third through via VIA13. The second and third chips CHIP2 and CHIP3 are electrically connected with each other through a second through via VIA12 and a fourth through via VIA14. Since the first and second through vias VIA11 and VIA12 are electrically connected with each other and the third and fourth through vias VIA13 and VIA14 are electrically connected with each other, the first to third chips CHIP1, CHIP2 and CHIP3 may be electrically connected with one another.

The first chip CHIP1 includes first and second voltage applying sections 410 and 420. The first voltage applying section 410 is disposed in the first chip CHIP1 and connects a test measurement unit 500 and one end of the first through via VIA11 with each other. The second voltage applying section 420 is disposed in the first chip CHIP1 and connects the test measurement unit 500 and one end of the third through via VIA13 with each other. The first and second voltage applying sections 410 and 420 perform the same function as the voltage applying section 130 shown in FIG. 2.

The second chip CHIP2 includes first and third current sink sections 610 and 630. The first current sink section 610 connects the other end of the first through via VIA11 and a ground voltage with each other. The third second current sink section 630 connects the other end of the third through via VIA13 and the ground voltage with each other.

The third chip CHIP3 includes second and fourth current sink sections 620 and 640. The second current sink section 620 connects the other end of the second through via VIA12 and the ground voltage with each other. The fourth second current sink section 640 connects the other end of the fourth through via VIA14 and the ground voltage with each other. The first to fourth current sink sections 610, 620, 630 and 640 perform the same function as the current sink section 140 shown in FIG. 2. The semiconductor apparatus 2 in accordance with an embodiment shown in FIG. 4 depicts a test circuit and a method for testing at least two chips and at least two through vias, and may be understood as an embodiment which is obtained by extending the semiconductor apparatus 1 in accordance with the embodiment shown in FIG. 2.

In FIG. 4, the first chip CHIP1 may further include a main test control unit 710, and the second and third chips CHIP2 and CHIP3 may further include first and second test control units 720 and 730, respectively. The main test control unit 710 is configured to generate test control signals TC1<0:3> to be allocated to the first and second voltage applying sections 410 and 420. The first test control unit 720 is configured to generate test control signals TC2<0:3> to be allocated to the first and third current sink sections 610 and 630, and the second test control unit 730 is configured to generate test control signals TC3<0:3> to be allocated to the second and fourth current sink sections 620 and 640. The main test control unit 710 may generate the allocated test control signals TC1<0:3> by decoding test address signals TC<0:n> which are inputted for performing a test. The main test control unit 710 may generate the test control signals TC1<0:3> regardless of a chip select signal CS. The first test control unit 720 receives the test address signals TC<0:n> and the chip select signal CS and generates the test control signals TC2<0:3> from the test address signals TC<0:n> in the case where the chip select signal CS selects the second chip CHIP2. The second test control unit 730 receives the test address signals TC<0:n> and the chip select signal CS and generates the test control signals TC3<0:3> from the test address signals TC<0:n> in the case where the chip select signal CS selects the third chip CHIP3. Meanwhile, the test address signals TC<0:n> and the chip select signal CS may be transmitted to the first to third chips CHIP1, CHIP2 and CHIP3 through other through vias or wiring lines.

Figure 5:
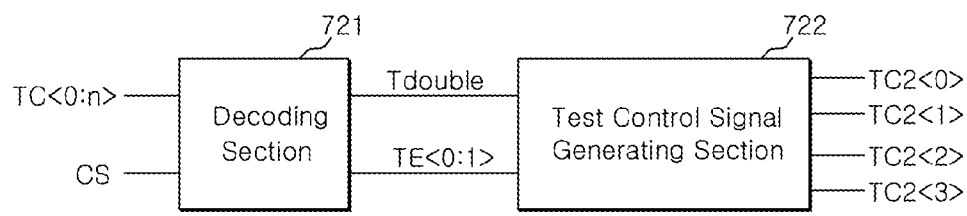
FIG. 5 depicts the first test control unit 720 of FIG. 4.

The second test control unit 730 has the same configuration as the first test control unit 720. In FIG. 5, the first test control unit 720 includes a decoding section 721 and a test control signal generating section 722. The decoding section 721 is configured to receive and decode the test address signals TC<0:n> and the chip select signal CS and generate test enable signals TE<0:1> and a double test signal Tdouble. The test control signal generating section 722 is configured to receive the test enable signals TE<0:1> and the double test signal Tdouble and generate the test control signals TC2<0:3> in a way similar to the operation of the test control unit 300 shown in FIG. 3. The bit numbers of the test address signals TC<0:n> and the chip select signal CS received by the decoding section 721 may increase or decrease depending upon the number of stacked chips which constitute the semiconductor apparatus and the number of through vias which electrically connect the stacked chips. Also, a person of ordinary skill in the art will appreciate that the bit number of the test enable signals TE generated by the decoding section 721 may be changed. The first and second test control units 720 and 730 have the same configuration. The main test control unit 710 may be realized not to receive the chip select signal CS or may be realized by a decoding circuit which can perform a decoding operation from the test address signals TC<0:n> regardless of the chip select signal CS. Otherwise, while not shown, in an alternative embodiment, configuration may be made such that only the main test control unit 710 includes the configuration of the decoding section which generates the test control signals TC1<0:3> by decoding the test address signals TC<0:n> and the first and second test control units 720 and 730 provide the test control signals TC2<0:3> and TC3<0:3> to the respective current sink sections 610, 620, 630 and 640 by combining the test control signals TC1<0:3> transmitted from the main test control unit 710 with the chip select signal CS.

The semiconductor apparatus 2 described with reference to FIGS. 4 and 5 may perform a test by specifying a particular through via. In the case where the test control signals TC1<0>, TC1<2>, TC2<0> and TC2<2> allocated to the first voltage applying section 610 and the first current sink section 610 are generated, it is possible to test whether the first through via VIA11 is properly formed. Further, in the case where the test control signals TC1<0>, TC1<2>, TC3<0> and TC3<2> allocated to the first voltage applying section 410 and the second current sink section 620 are generated, the resistance values of the first and second through vias VIA11 and VIA12 may be measured by measuring the amounts of current flowing through the first and second through vias VIA11 and VIA12, and from this fact, it is possible to determine precisely whether the first and second through vias VIA11 and VIA12 are properly formed.

While certain embodiments have been described above, it will be understood to those skilled in the art that the embodiments described are by way of example only. Accordingly, the test circuit and the semiconductor apparatus including the same described herein should not be limited based on the described embodiments. Rather, the test circuit and the semiconductor apparatus including the same described herein should only be limited in light of the claims that follow when taken in conjunction with the above description and accompanying drawings.

What is claimed is:

1. A test circuit comprising:
   a test control unit configured to generate a pulse of a first test control signal and then generate pulses of first and second test control signals;
   a voltage applying section configured to apply a first voltage to a through via, that electrically connects a first chip and a second chip, in response to the first test control signal and apply a second voltage to the through via in response to the first and second test control signals; and
   a current sink section configured to sink current flowing through the through via with a first current sink capability in response to the first test control signal and sink current flowing through the through via with a second current sink capability in response to the first and second test control signals.

2. The test circuit according to claim 1,
   wherein the test control unit generates the first and second test control signals by receiving a test enable signal and a double test signal, and
   wherein the test control unit generates the first test control signal based on the test enable signal when the double test signal is disabled, and generates the first and second test control signals based on the test enable signal when the double test signal is enabled.

3. The test circuit according to claim 1, wherein the voltage applying section comprises:
   a first selection part configured to apply a test voltage to the through via in response to the first test control signal; and
   a second selection part configured to apply the test voltage to the through via in response to the second test control signal.

4. The test circuit according to claim 1, wherein the current sink section comprises:
   a first driver configured to sink current flowing through the through via to a ground voltage in response to the first test control signal; and
   a second driver configured to sink current flowing through the through via to the ground voltage in response to the second test control signal.

5. A test method comprising:
   selecting a first resistor in response to a first test control signal, and measuring first current flowing through a path that includes a through via electrically connecting first and second chips and the first resistor;
   selecting a second resistor with a value different from the first resistor in response to the first test control signal and a second test control signal, and measuring second current flowing through a path that includes the through via and the second resistor; and
   comparing the first and second current and calculating a resistance value of the through via.

6. A semiconductor apparatus including a first through via that connects a first chip and a second chip, and a second through via that connects the second chip and a third chip, the first and second through vias being electrically connected with each other, the semiconductor apparatus comprising:
   a voltage applying section disposed in the first chip and configured to apply one of a first voltage and a second voltage to the first through via in response to first and second test control signals;
   a first current sink section disposed in the second chip and configured to sink current flowing through the first through via with one of first and second current sink capabilitys in response to a chip select signal and the first and second test control signals; and
   a second current sink section disposed in the third chip and configured to sink current flowing through the first and second through vias with one of the first and second current sink capabilitys in response to the chip select signal and the first and second test control signals.

7. The semiconductor apparatus according to claim 6, wherein the voltage applying section comprises:
   a first selection part configured to apply a test voltage to the first through via in response to the first test control signal; and
   a second selection part configured to apply the test voltage to the first through via in response to the second test control signal.

8. The semiconductor apparatus according to claim 6, further comprising:
   a first test control unit disposed in the second chip and configured to supply the first and second test control signals to the first current sink section when the chip select signal selects the second chip; and
   a second test control unit disposed in the third chip and configured to supply the first and second test control signals to the second current sink section when the chip select signal selects the third chip.

9. The semiconductor apparatus according to claim 8, wherein the first current sink section comprises:
   a first driver configured to drive the first through via to a ground voltage in response to the first test control signal; and
   a second driver configured to drive the first through via to the ground voltage in response to the second test control signal.

10. The semiconductor apparatus according to claim 9, wherein the second current sink section comprises:
    a third driver configured to drive the second through via to the ground voltage in response to the first test control signal; and
    a fourth driver configured to drive the second through via to the ground voltage in response to the second test control signal.

* * * * *